United States Patent [19]  
Takahashi et al.

[11] Patent Number: 4,619,043  
[45] Date of Patent: Oct. 28, 1986

[54] APPARATUS AND METHOD FOR MOUNTING CHIP TYPE ELECTRONIC PARTS

[75] Inventors: Tetsuo Takahashi; Yoshinobu Taguchi; Kenichi Saito, all of Tokyo, Japan

[73] Assignee: TDK Corporation, Japan

[21] Appl. No.: 591,190

[22] Filed: Mar. 19, 1984

[30] Foreign Application Priority Data

| May 2, 1983 | [JP] | Japan | 58-76205 |
| May 19, 1983 | [JP] | Japan | 58-73690[U] |
| May 19, 1983 | [JP] | Japan | 58-73691[U] |
| Jun. 2, 1983 | [JP] | Japan | 58-82970[U] |
| Jun. 6, 1983 | [JP] | Japan | 58-85019[U] |
| Jun. 13, 1983 | [JP] | Japan | 58-89175[U] |
| Jun. 23, 1983 | [JP] | Japan | 58-96956[U] |

[51] Int. Cl.$^4$ .......... H05K 3/34; B23P 19/00; B65G 29/00
[52] U.S. Cl. .......... 29/840; 29/740; 198/803.7; 269/254 R; 269/903; 294/19.1; 294/119.1
[58] Field of Search .......... 29/740, 840, 738; 228/6.2; 198/695, 803.7; 269/254, 903; 414/752, 751; 294/19.1, 119.1

[56] References Cited

U.S. PATENT DOCUMENTS

| 2,698,765 | 1/1955 | Eagle. | |
| 2,783,869 | 3/1957 | Thurman. | |
| 3,312,325 | 4/1967 | Beck et al. | 29/740 X |
| 3,711,905 | 1/1973 | Eckerdt et al. | |
| 3,754,667 | 8/1973 | Storch | 414/751 X |
| 3,757,961 | 9/1973 | Jacobs | 414/751 X |
| 3,887,996 | 6/1975 | Hartleroad et al. | 414/751 X |
| 4,307,832 | 12/1981 | Taki et al. | 228/6.2 X |
| 4,372,802 | 2/1983 | Harigane et al. | 29/738 X |
| 4,458,412 | 7/1984 | Dean et al. | 29/740 X |
| 4,501,064 | 2/1985 | DiNozzi et al. | 29/740 X |
| 4,502,829 | 3/1985 | St. Cyr | 29/740 X |

FOREIGN PATENT DOCUMENTS 2096498 10/1982 United Kingdom .......... 29/740

Primary Examiner—Howard N. Goldberg  
Assistant Examiner—Carl J. Arbes  
Attorney, Agent, or Firm—Steinberg & Raskin

[57] ABSTRACT

An apparatus and method for mounting chip type electronic parts, in which the parts can be smoothly, reliably and accurately mounted on, for example, a printed circuit board. The apparatus for mounting the chip type parts comprises means for conveying the part to be mounted, means for supplying the part onto the conveying means, means for receiving the part from the conveying means and for mounting the same onto a printed circuit board for example, and also means for positioning the part upon the conveying means before transfer of the part to the receiving and mounting means. The method for mounting a chip type part according to the present invention comprises the steps of supplying the part onto means for conveying the same to be mounted, positioning of the part on the conveying means, and then removing the part off the conveying means and mounting the same.

15 Claims, 28 Drawing Figures

FIG.4
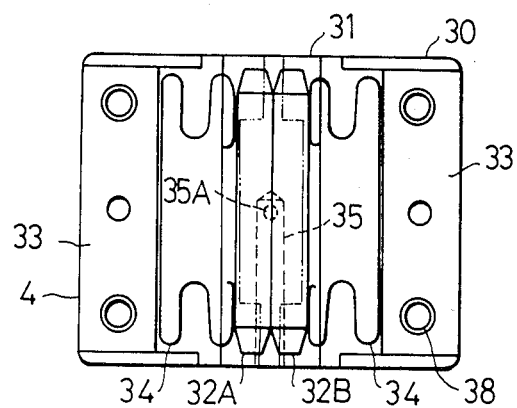
FIG.5(A)  FIG.5(B)
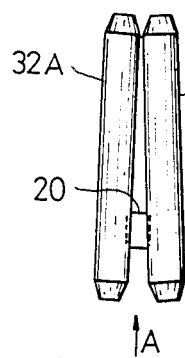
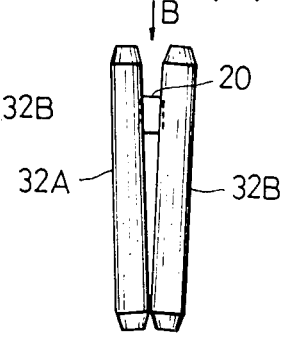
FIG.6
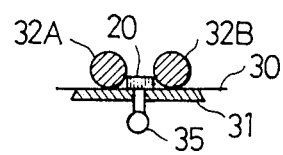

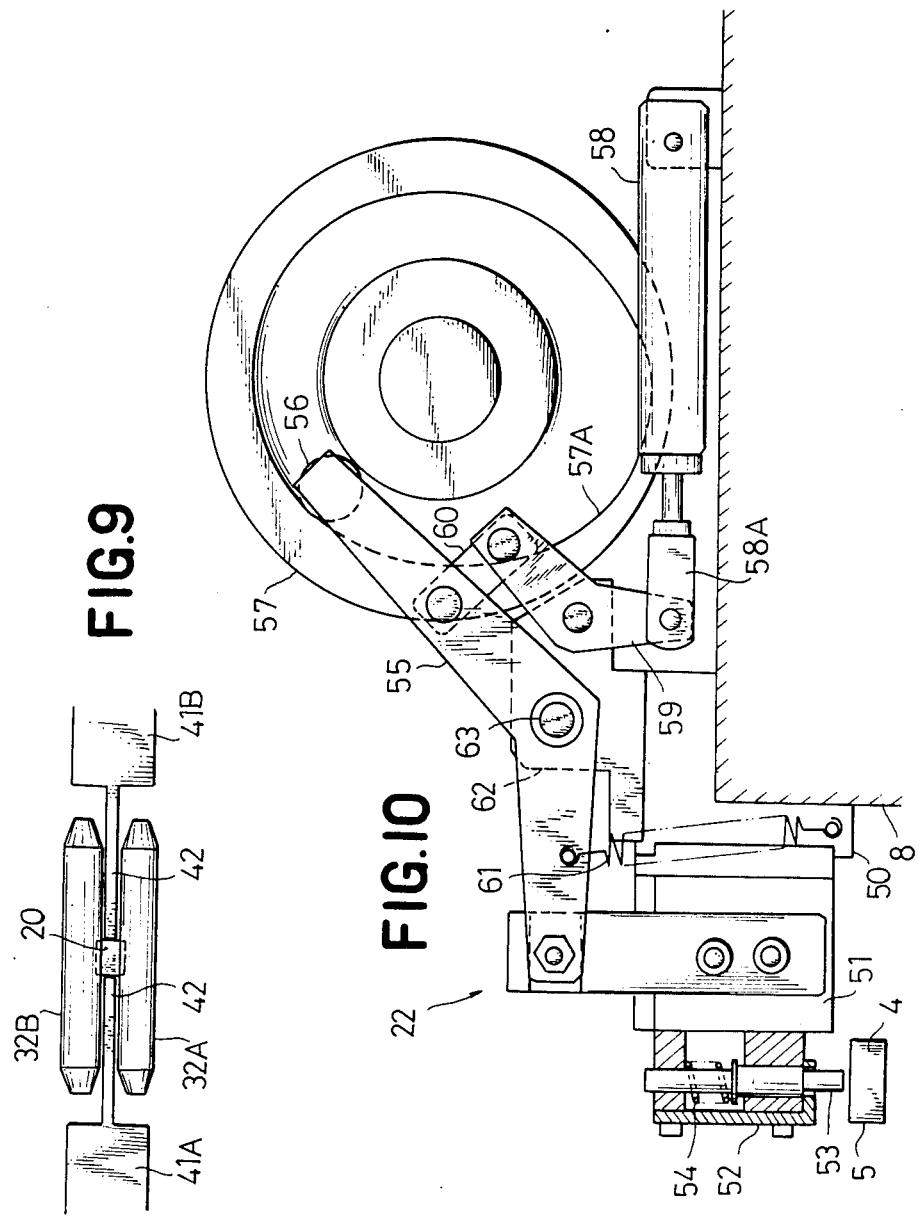

APPARATUS AND METHOD FOR MOUNTING CHIP TYPE ELECTRONIC PARTS

BACKGROUND OF THE INVENTION

The present invention generally relates to an apparatus and method for mounting chip type electronic parts, one by one, onto a printed circuit board. More particularly, the present invention is directed to an apparatus and method for mounting chip type electronic parts having no lead wires upon a printed circuit board, one by one. The present invention is also directed to a pallet for conveying the chip type electronic parts, especially such parts without lead wires, to be mounted on a printed circuit board.

A conventional mounting apparatus and method for chip type electronic parts is disclosed in U.S. patent application Ser. No. 409,184, filed Aug. 18, 1982, in which a pallet retaining a chip type electronic part runs along a horizontal plane. The chip type electronic part is supplied from a supply unit disposed on only side of a pallet runway. Thus, an unavoidable disadvantage with such a type of apparatus as disclosed in this patent application, is the necessitation of a large space for installation. Furthermore, no centering of the chip type electronic part retained on the pallet is carried out with the apparatus and method of U.S. patent application Ser. No. 409,184, nor is there any detection of the presence of the chip type electronic part on the pallet itself. Therefore, a mechanism for shifting the chip type electronic part onto the pallet from a supply unit in the apparatus of U.S. patent application Ser. No. 409,184 is complicated, so that reliability of ultimate mounting of the chip type electronic part onto the printed circuit board will eventually deteriorate.

SUMMARY OF THE INVENTION

Accordingly, it is an object of the present invention to provide an apparatus and method for mounting chip type electronic parts, in which the space required for installation is minimized by running a pallet carrying the chip type electronic part for mounting, along a vertical plane.

It is also an object of the present invention to provide an apparatus and method for mounting chip type electronic parts, wherein the reliability of such mounting of the chip type electronic part is enhanced by providing means for positioning the chip type electronic part on a pallet as the part is carried along for mounting.

It is a further object of the present invention to provide an apparatus and method for mounting chip type electronic parts, in which the reliability of mounting of the chip type electronic part is enhanced by provision of means for detecting the presence of such chip type electronic parts on a pallet carrying the parts for mounting.

It is still another object of the present invention to provide an apparatus and method for mounting chip type electronic parts, in which reliability of such mounting of the chip type electronic part is enhanced, by provision of means for reorienting position of the chip type electronic part, prior to mounting upon a printed circuit board. It is also a further object of the present invention to provide an apparatus and method for mounting chip type electronic parts such as an electronic part having a lead electrode, in which reliability of mounting of such a type of electronic part is enhanced by provision of means for transforming the lead electrode of such parts, so that a tip of the lead electrode will be positioned almost on the same plane as a bottom of the chip type electronic part, for example.

It is even a further object of the present invention to provide a pallet for conveying chip type electronic parts to be mounted on a printed circuit board, one by one, so that each individual chip type electronic part can be reliably and accurately centered, positioned, and conveyed to be mounted upon the printed circuit board.

These and other objects are attained by the present invention, which provides an apparatus for mounting chip type electronic parts, comprising means for conveying the chip type electronic part to be mounted, means for supplying each chip type electronic part to said conveying means, and being disposed on at least one side of a substantially horizontal path for said conveying means, means for receiving each chip type electronic part from said conveying means, and for mounting the same upon a printed circuit board, and means for positioning each chip type electronic part upon said conveying means, before each said part is delivered to said receiving and mounting means.

More specifically, in the apparatus of the present invention, the conveying means comprises a pallet mounted on an endless belt mechanism, at least part of which runs in a horizontal and a vertical plane to intermittently convey the pallet therealong, said supplying means comprises a supply unit disposed on at least one side of a substantially horizontal runway for the pallet, the receiving and mounting mechanism comprises a mounting head for receiving a supply of the chip type electronic parts at a predetermined shifting position from the pallet and mounting the chip type electronic parts onto the printed circuit board.

The apparatus of the present invention additionally comprises means for detecting presence or nonpresence of a chip type electronic part upon the pallet after the same passes through said positioning means. Moreover, in the case where the chip type electronic parts contain lead electrodes, the apparatus of the present invention comprises means for transforming the electronic parts and lead electrodes so that the bottom of the electronic parts and the lead electrodes are disposed along substantially the same plane on top of the pallets.

In a preferred embodiment of the present invention, the apparatus may also comprise means for reorienting each chip type electronic component when the same is disposed upon said mounting head, so that each individual chip type electronic part is oriented or rotated in the proper position for mounting upon a printed circuit board, and also means for shifting the part onto the receiving/mounting means from the conveying means.

The present invention is also directed to a pallet as part of said means for conveying each individual chip type electronic part to be mounted on a printed circuit board, in which said pallet comprises a pair of retaining bars movably disposed upon a base thereof, to retain each individual chip type electronic part upon the base, and also comprises means for urging the retaining bars in a direction towards one another in order to retain each individual chip type element upon the pallet.

The present invention is also directed to a method for mounting chip type electronic parts upon a printed circuit board, which comprises the steps of placing individual chips upon means for conveying the same to be mounted upon the printed circuit board, positioning each individual chip upon said conveying means, and shifting each individual chip type electronic part off said conveying means and onto the printed circuit board, after each individual chip type electronic part has been positioned upon the said conveying means.

The method of the present invention may also comprise the additional steps of detecting the presence of a chip type electronic part upon said conveying means, after each chip type electronic part has been positioned upon said conveying means and before the same is shifted onto the printed circuit board, and also, in the case where the chip type electronic part has lead electrodes, transforming the individual chip type electronic parts so that a tip of the lead electrode and a bottom surface of the electronic part are oriented in substantially the same plane.

The method of the present invention may additionally comprise the step of orienting the individual chip type electronic parts as they are shifted from said conveying means and mounted onto the printed circuit board, so that each individual chip type electronic part is mounted upon the printed circuit board in a particular orientation.

With the present invention, the space required for installation of such an apparatus is greatly minimized, since individual chip type electronic parts are directed to be mounted upon a printed circuit board, by being placed upon conveying means that extends both in a substantially horizontal and a substantially vertical direction. Moreover, means for supplying the individual chip type electronic parts upon said conveying means may be disposed on both sides of the path of said conveying means, notably the substantially horizontal portion of said path, additionally contributing to minimization of space requirements for the apparatus of the present invention.

The provision of means for positioning each individual chip type electronic part upon said conveying means, such as a pallet conveying the same, assures that the chip type electronic part will be in the proper location for shifting and mounting the same upon the printed circuit board. Provision of means for detecting whether or not a chip type electronic part is positioned on a pallet, allows for the determination of a possible misfeed that has occurred in the mounting operation. These features thus prevent the occurrence of a mounting miss in the placement of the chip type electronic parts upon a printed circuit board.

Provision of the means for transforming a chip type electronic part having lead electrodes, such as a transistor, allows such type of chip type electronic parts to be mounted upon a printed circuit board. Moreover, the particular arrangement of means for orienting the chip type electronic part upon said receiving and mounting means, allows for tremendous simplification in the ultimate mounting of the electronic parts upon the printed circuit board.

BRIEF DESCRIPTION OF THE DRAWINGS

These and other features of the present invention, will become apparent from the following description with reference to the accompanying drawings, in which one embodiment of an apparatus for mounting chip type electronic parts is illustrated.

In the accompanying drawings,

FIG. 4 is a top plan view of the pallet of FIG. 3;

FIGS. 5(A) and (B) are operational diagrams of the pallet of FIGS. 3 and 4;

FIG. 6 is a fragmentary sectional view of the pallet of FIGS. 3 and 4 retaining a chip type electronic part therein;

FIG. 9 is an operational diagram of the positioning means of FIGS. 7 and 8;

FIG. 10 is a side elevational view of means for transforming a chip type electronic part having lead electrodes, in accordance with the present invention;

DETAILED DESCRIPTION OF A PREFERRED EMBODIMENT

The following description of a preferred embodiment of the present invention is merely exemplary, and is not intended to limit the scope thereof in any way.

Figure 1:
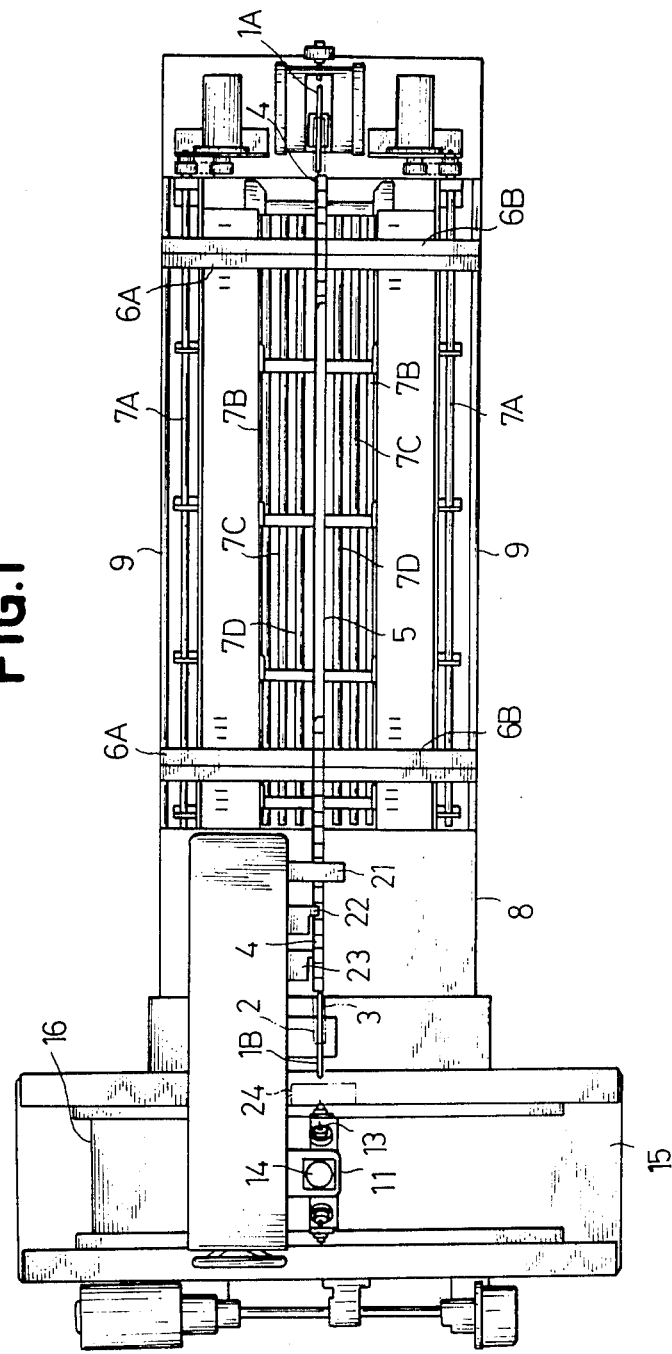
FIG. 1 is a top plan view of an apparatus for mounting chip type electronic parts according to the present invention.
Figure 2:
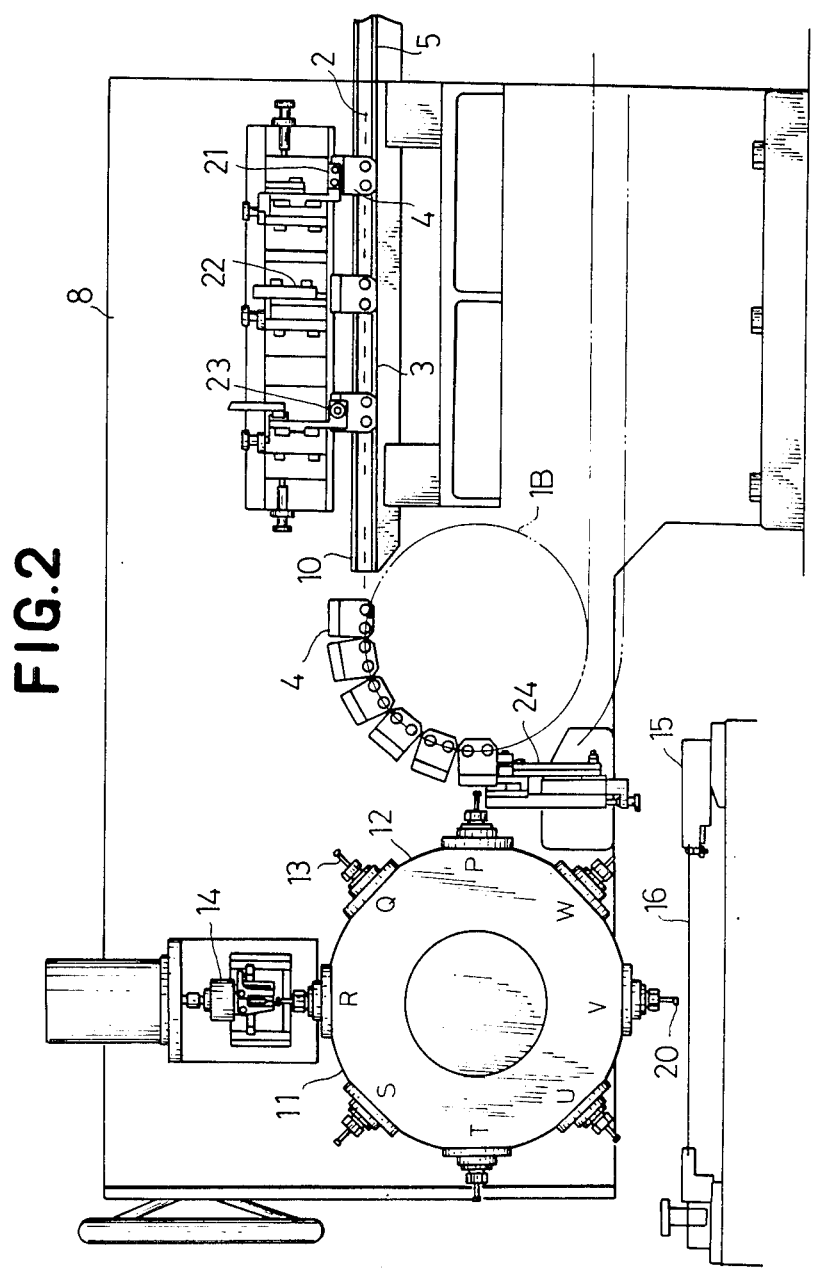
FIG. 2 is a front view of the mounting apparatus of FIG. 1.

Referring to the drawings, FIGS. 1 and 2 illustrate the general construction of a mounting apparatus for chip type electronic parts, in accordance with the invention. As is apparent from the drawings, a chain 2 is laid between a pair of sprockets 1A, 1B, to constitute means for conveying the individual electronic chips to be mounted. This means is in the form of a chain conveyor running intermittently between a horizontal plane and a vertical plane, as illustrated. A plurality of pallets are mounted at regular intervals on an outer periphery of the chain 2, these pallets being ready for intermittent conveying along the chain 2 according to the intermittent running thereof.

Supply units 6A, 6B, such as disclosed in U.S. patent application Ser. No. 409,184, are disposed along the means 3 for conveying the chip type electronic parts, in the same arrayed intervals as the pallets 4 disposed on the conveying means 3, in order to face a linearly-arrayed group of pallets 4 on an upper side of the conveying means, along which the chain 2 runs horizontally. In other words, the supply unit 6A, 6B are disposed on both sides of a substantially horizontal runway 5 for the pallets 4, as best seen in FIG. 1.

In this instance, the supply units 6A, 6B operate for supplying one particular kind of chip type electronic part on each of the pallets 4, according to a predetermined sequence in a mounting program for chip-type electronic parts. Supply unit 6A, 6B are supported on a unit supporting frame 9 which is firmly provided with a body frame 8. Drive shafts 7A, 7B, 7C and 7D are provided on the supporting frame 9, in common with each of the supply units 6A, 6B. Additionally, a chain guide 10 is affixed onto the body frame 8, in order to guide the chain 2 along the substantially horizontal runway 5, in a substantially straight line.

Means 11 for receiving the chip type electronic parts and mounting the same upon a printed circuit board, for example, is provided adjacent to sprocket 1B on the conveying means 3. This receiving and mounting means is formed with mounting heads 13 radially disposed on an indexing disc 12, at isogonal intervals (45°), as viewed in FIG. 2. The indexing disc 12 is disposed to rotate by 45° in each interval. The midpoint of a circular arc along sprocket 1B along which the pallet 4 runs, represents the position at which a chip type electronic part 20 is shifted onto the mounting head 13 from a respective pallet 4.

Means 14 for orienting the individual chip type electronic parts upon the respective mounting heads 13, are disposed over the receiving and mounting means 11, and an X-Y table is disposed underneath the receiving and mounting means 11, as illustrated in FIG. 2. Each individual mounting head 13 operates to suction the respective chip type electronic part 20 off the respective pallet, and mount that particular electronic part 20 onto an adhesive coating position of a printed circuit board 16 disposed on the X-Y table 15.

At a location where the horizontal path or runway 5 of the pallet 4 approaches sprocket 1B (or a location along the horizontal path 5 after the supply units 6A, 6B), means 21 for positioning the chip type electronic parts 20 retained on the respective pallets 4 in a particular position (i.e. a substantially central position on the respective pallets 4), means 22 for transforming chip type electronic parts having a lead electrode so that a tip of the lead electrode is positioned on substantially the same plane as a bottom the electronic part (in the case of a transistor), and means 23 for detecting whether or not a chip type electronic part 20 is present on a respective pallet 4, are all provided. Additionally, means 24 for shifting the respective chip type electronic parts 20 from the pallets 4 onto respective mounting heads 13 at position P in FIG. 2, is provided along sprocket 1B at the shifting position (i.e. where the path of the conveying means is substantially vertical).

PALLET

Figure 3:
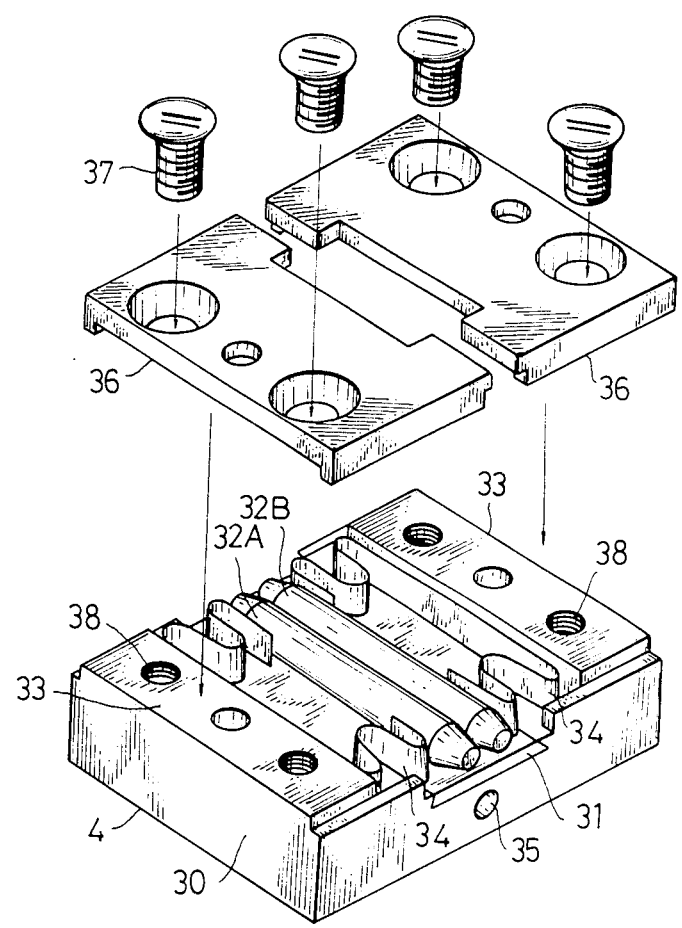
FIG. 3 is an exploded perspective view of a pallet for conveying chip type electronic parts to be mounted, in accordance with the present invention.

The pallet 4 is illustrated in detail in FIGS. 3–6. A bedplate 31 is provided at the central portion of a pallet base 30 that is mounted on the chain 2, and a pair of round retaining bars 32A, 32B are movably provided thereon. Both ends of the round retaining bars 32A, 32B are tapered. Both ends of the pallet base 30 form a high-stepped convexity 33, while curved compression leaf springs 34 are each provided between the inside of the high-stepped convexity 33 and the respective round retaining bars 32A, 32B, as seen in FIGS. 3 and 4. Therefore, both of the round retaining bars 32A, 32B are urged in a close direction towards one another.

A suction hole opening from the front center to the top center of the pallet base 30 is formed in the same, suction hole 35 being used when the chip type electronic part is to be detected for position and shifted onto the receiving and mounting means 11. A top cover 36 is disposed on the pallet base 30, over the round retaining bars 32A, 32B and over the compression leaf springs 34. This top cover 36 is mounted by securing fitting screws 37 in tapped holes 38 on the high-stepped convexity 33 of the pallet 4.

The pallet 4 illustrated in FIGS. 3–6 is able to accept a chip type electronic part 20 supplied from either side of the conveying means 3 by supply unit 6A, 6B. As illustrated in FIG. 5(A), when a chip type electronic part is to be inserted on the pallet 4 from a direction indicated by arrow A, the round retaining bars 32A, 32B are spread apart at noses or ends thereof, to accept the requisite chip type electronic part 20. Then, the chip type electronic part 20 is retained by bars 32A, 32B through the action of the leaf springs 34, between the bedplate 31 of the pallet base 30 and the respective retaining bars themselves. The chip type electronic part 20 is then usually pushed as far as possible between the retaining bars 32A, 32B, generally over an opening 35A of the suction hole 35 in the bedplate 31 of the pallet 4 (FIG. 4), such opening 35A generally being disposed at the midpoint of the length of the respective retaining bars 32A, 32B, as illustrated in FIG. 4.

Alternatively, as illustrated in FIG. 5(B), the chip type electronic part 20 may be inserted from an opposite direction B or rear end of the round retaining bars 32A, 32B as indicated by arrow B in this particular figure. The rear ends or opposite sides of the round retaining bars 32A, 32B open in similar fashion to FIG. 5(A) to accept the chip type electronic part 20, which is then retained between the respective bars 32A, 32B over opening 35A of suction hole 35, as illustrated in FIG. 6.

MEANS FOR POSITIONING THE ELECTRONIC PARTS

Figure 7:
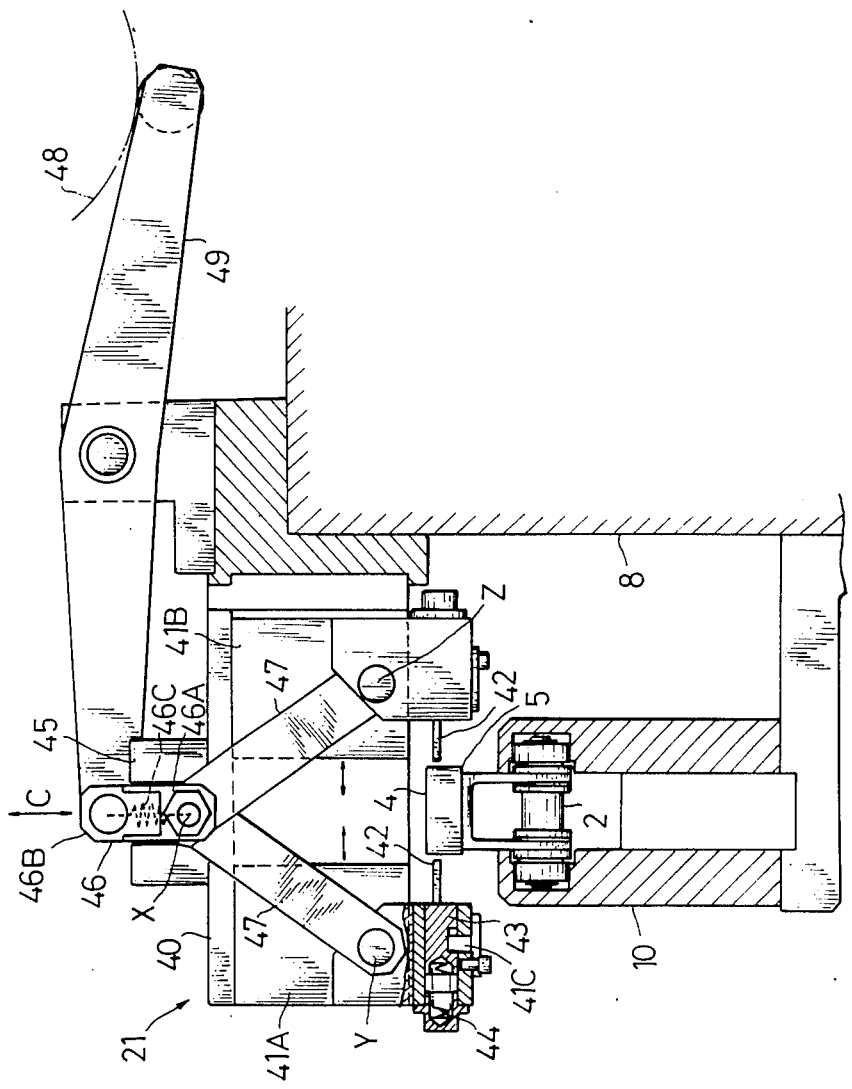
FIG. 7 is a side elevational view, partially in section, of means for positioning a chip type electronic part, in accordance with the present invention.
Figure 8:
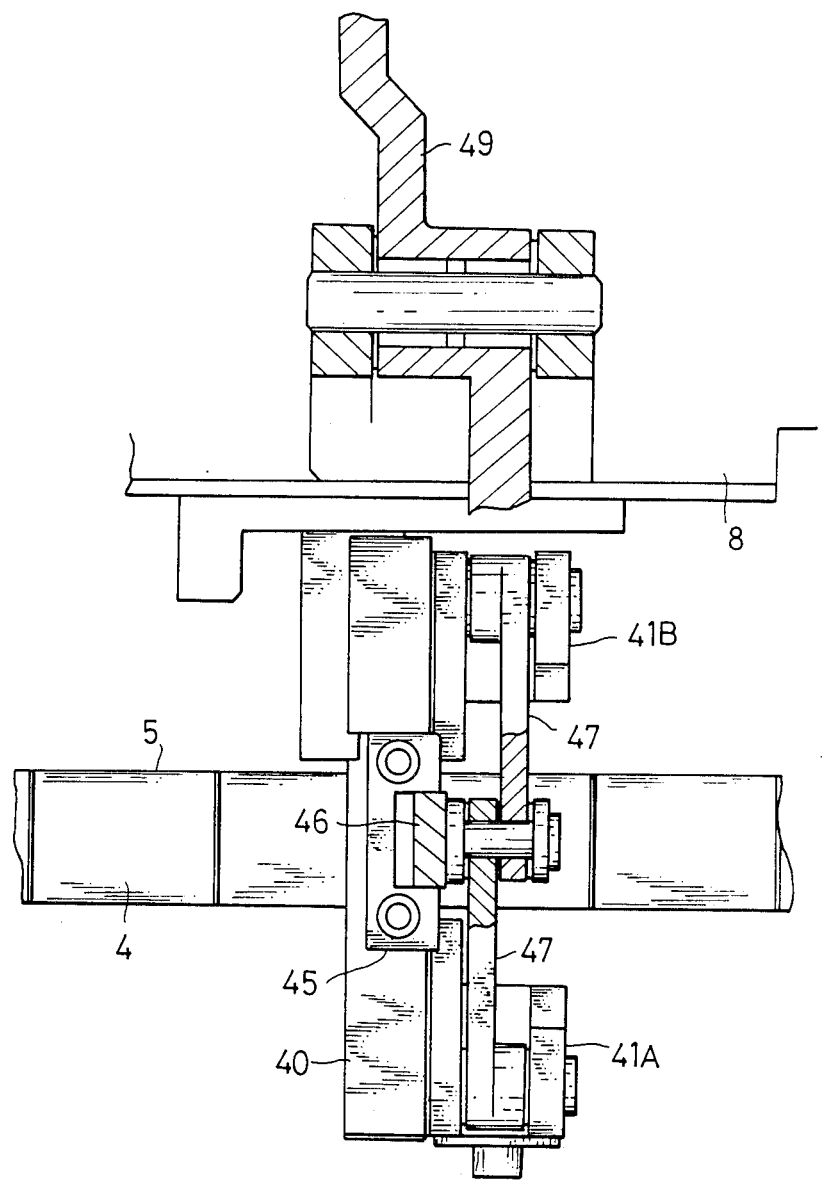
FIG. 8 is a top plan view of the positioning means of FIG. 7.

FIGS. 7–9 illustrate the means 21 for positioning the respective chip type electronic parts 20 upon the respective pallets 4. A supporting member 40 is provided on the front of body frame 8, and disposed in such a manner to perpendicularly traverse over the horizontal runway 5 on which the pallets 4 run in a substantially horizontal, straight line. A pair of slide blocks 41A, 41B are disposed on an underside of supporting member 40 as illustrated in FIG. 7, while positioning blocks 43, each having a positioning pin 42, are each disposed on a respective slide block 41A, 41B and disposed to be slidable in a substantially horizontal direction.

Each of these positioning blocks 43 are urged in a forward, projecting direction, by a respective compression spring 44. Additionally, slide block 41A, 41B are each provided with a stopper 41C for regulating the projection of the respective positioning blocks 43.

A slide bearing 45 is affixed on support member 40 and supports a vertical slider 46 to be vertically slidable in a direction indicated by arrow C. Slide blocks 41A, 41B are coupled to the slider 46 through links 47 of equal length. Therefore, supporting points X, Y, and Z of the equal-length links 47 form an isosceles triangle, so that both positioning pins 42 on respective positioning blocks 43 will move symmetrically when actuated, with respect to a center line of a pallet 4 mounted on chain 2 supported by chain guide 10, the center line of such pallet 4 being coincident with the center line of the vertical slider 46.

An upper end of the vertical slider 46 is coupled to a lever 49 that is subjected to the driving force of a cam 48. Vertical slider 46 is arranged to have a lower slider part 46A and an upper slider part 46B fitted together, both parts being coupled through a spring 46C. Extra driving force of the cam is thus absorbed by expansion of the spring 46C, so that excessive force is not exerted onto the chip type electronic part 20 by the positioning pins 42.

In the above means for positioning the chip type electronic parts 20 on respective pallets 4, when a respective pallet 4 stops underneath supporting member 40, positioning pins 42 are positioned between the round retaining bars 32A, 32B on the bedplate 31 of the respective pallet 4. Then, when vertical slider 46 is driven upwardly by lever 49 being subjected to the driving force of cam 48 as noted above, the opposite positioning pins approach one another as illustrated in FIG. 9, thus disposing the chip type electronic part 20 substantially at the center of the respective pallet 4 above opening 35A of suction hole 35 (i.e. at the midpoint of the length of the retaining bars 32A, 32B as illustrated). Therefore, a chip type electronic part 20 can be situated at the center of a respective pallet 4 at all times, regardless of the position at which the chip type electronic part 20 is supplied onto a respective pallet 4, so that a subsequent operation of shifting the chip type electronic part 20 onto a mounting head 13 for example, can be executed securely, smoothly, and accurately.

MEANS FOR TRANSFORMING ELECTRONIC PARTS HAVING LEADS

Figure 11:
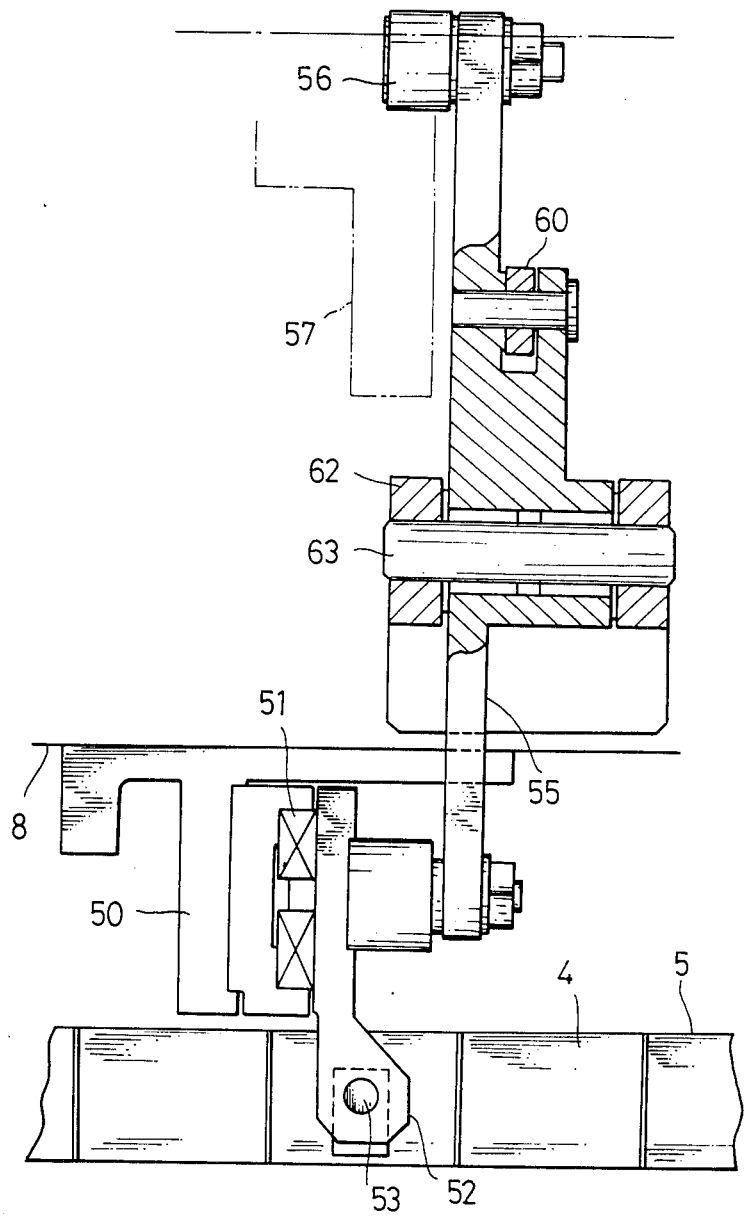
FIG. 11 is a top plan view of the transforming means of FIG. 10.

FIGS. 10-12 illustrate means 22 for transforming particular kinds of chip type electronic parts 20A that have leads such as lead electrodes 20B. As illustrated in FIGS. 10 and 11, a support member 50 is affixed to a front of the body frame 8, and projects over the horizontal path 5 of the respective pallets 4. A slide block 51 is provided within support member 50 and disposed to be vertically slidable therein. A push rod 53 is supported to be vertically slidable on slide block 51 through a mounting member 52, the push rod 53 being urged in a downward direction by compression spring 54.

Slide block 51 is pivoted at one end of a lever 55 which operates as a cam follower mounted on a bracket 52 on the body frame 8 through shaft 63. Roller 56 on the other end of lever 55 is in contact with an inner periphery cam face 57A of the cam 57. A cylinder 68 is disposed on body frame 8 with a piston rod 58A of this cylinder 58 being pivoted on one end of a lever 59 as illustrated. The other end of the lever 59 is coupled to the lever 55 midway between shaft 63 and roller 56, through a link 50. Expansion spring 61 for urging slide block 51 in a downwardly direction, is provided between lever 55 and body frame 8.

In the operation of the apparatus of the present invention, the respective pallets 4, retaining and conveying the respective chip type electronic parts, run intermittently along the horizontal runway 5 in a substantially straight line. If the electronic parts 20 are of the type not having any leads extending therefrom, when a respective pallet carrying a respective electronic part 20 passes the transforming means 22, cylinder 58 is retained in an extended position when the respective pallet 4 stops directly underneath push rod 53. More specifically, the lever 55 is turned in a clockwise direction through lever 59 and link 60, and the roller 56 is detached from cam face 57A, thus retaining slide block 51 in a raised position. Therefore, when a chip type electronic part 20 is not of the type having leads or lead electrodes, as is normally the case with such chip type electronic parts, no transforming process will be carried out with this transforming means accordingly.

However, when a pallet 4 retaining an electronic part 20A of the type having a lead electrode 20B, such as a transistor or the like, arrives directly underneath push rod 53, then cylinder 58 actuates for contracting, with roller 56 of lever 55 now coming into contact with cam face 57A. Consequently, when lever 55 turns in a counterclockwise direction according to the rotation of cam disc 57, slide block 51 or push rod 53 is pushed down in the direction of arrow D in FIG. 12(A), onto the electronic part 20A retained between respective bars 32A, 32B on the pallet 4. Thus, push rod 53 will reposition electronic part 20A so that a tip of the lead electrode 20B is disposed approximately on the same plane as the bottom of the electronic part 20A.

MEANS FOR DETECTING PRESENCE OF CHIP TYPE ELECTRONIC PARTS

Figure 13:
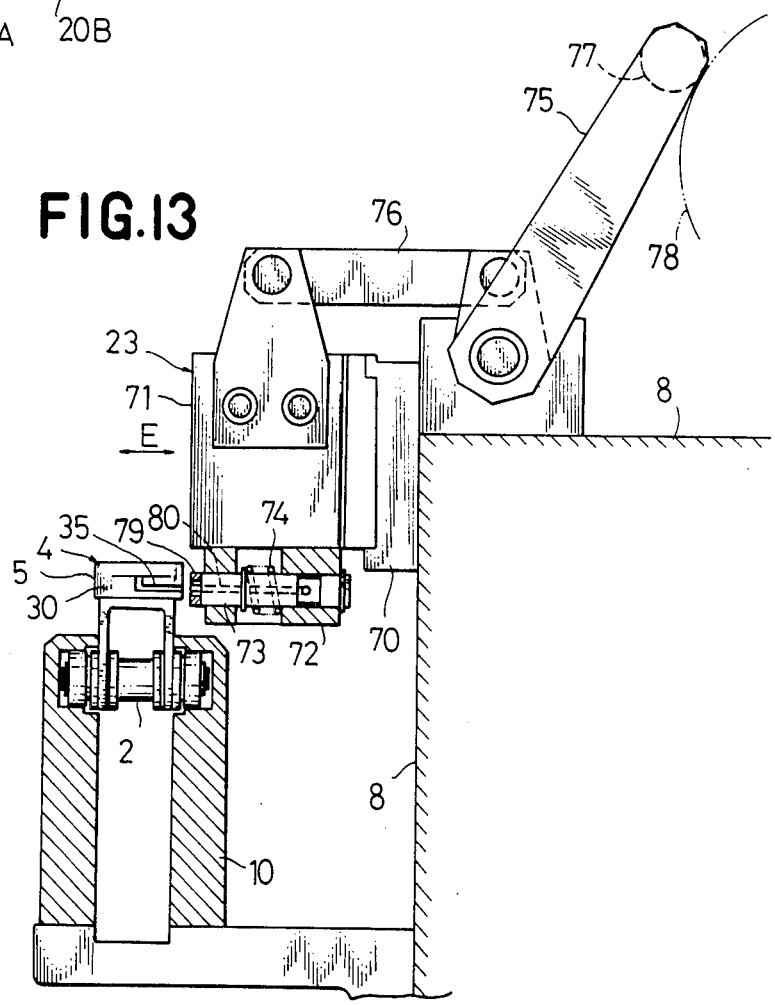
FIG. 13 is a side elevational view of means for detecting presence of a chip type electronic part, in accordance with the present invention.
Figure 14:
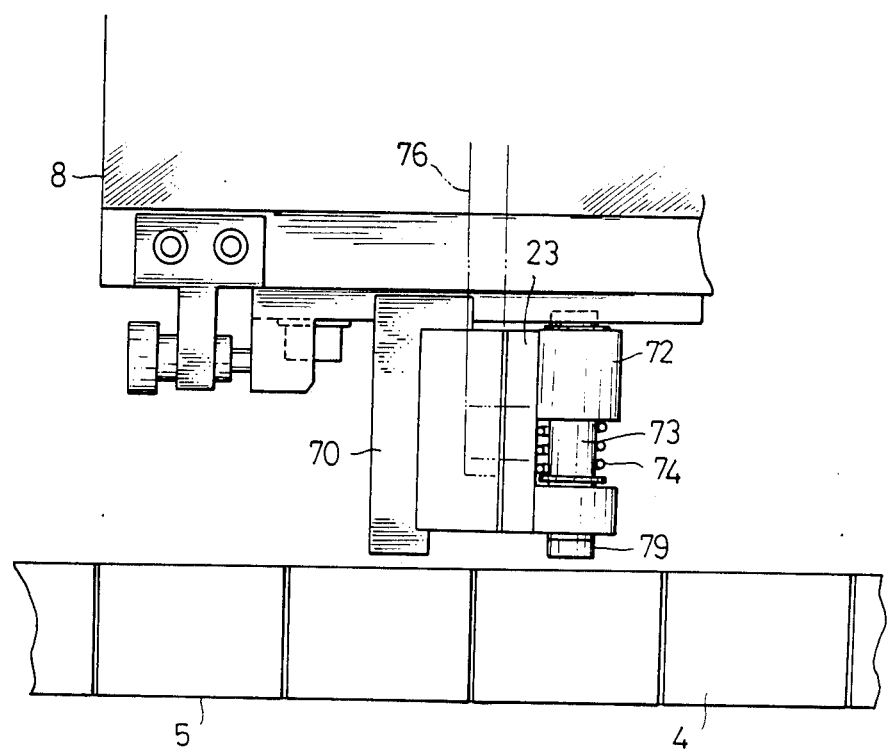
FIG. 14 is a top plan view of the detecting means of FIG. 13.

FIGS. 13 and 14 illustrate means 23 for detecting whether or not a chip type electronic part 20 is present on a respective pallet 4. Referring to these figures, supporting member 70 is fixed on the front of body frame 8 facing the horizontal path or runway 5 for the pallets 4, with a slide block 71 disposed against supporting member 70 and adapted to be slidable in a substantially horizontal direction, such as indicated by arrow E in FIG. 13. A detecting rod 73 is supported on the slide block 71 through a mounting member 72, to be slidable in a horizontal direction too. Furthermore, the detecting rod 73 is urged in a forward direction towards the pallet 4, by a compression spring 74.

The slide block 71 is coupled to one end of a bell crank 75 which operates as a cam follower and is mounted on body frame 8 through link 76. A roller 77 is mounted on the other end of the bell crank 75 and is in contact with a cam 78. The bell crank 75 is urged into continuous contact with the cam 78 by a spring or the like. Packing material 79 such as rubber or the like is affixed to the front of the detecting rod 73, with a detecting suction hole 80 being formed within rod 73 and penetrating the center of the packing material 79.

In the operation of the means 23 for detecting presence of an electronic part 20 upon a respective pallet 4, when the pallet 4 temporarily stops in front of means 23, bell crank 75 is turned in a counterclockwise direction by cam 78, so that the nose of the detecting rod 73 is pressed onto a front center of the pallet base 30, and the suction hole 35 opening onto the side of the pallet base 30 and the detecting suction hole 80 coincide to communicate with one another. Air is then suctioned out of the opposite end of the detecting suction hole 80, to create a negative or vacuum-type pressure therein.

In the case where a chip type electronic part 20 is present at a predetermined central position on the bedplate 31 of the pallet 4, i.e. covers the opening 35A of the suction hole 35 on the bedplate 31 of the pallet 4, then the negative pressure created within the detecting suction hole 80 will remain relatively great. However, where a chip type electronic part 20 is not present on the pallet 4, i.e. does not cover the opening 35A on the bedplate 31 of the pallet 4, then this end of suction hole 35 opens to the atmosphere, and any negative pressure created within suction hole 80 will dissipate rapidly. Therefore, presence or absence of a chip type electronic part 20 upon a respective pallet 4 can be ascertained if the negative pressure created within suction hole 80 of the detecting means 23 is maintained or dissipates.

MEANS FOR RECEIVING AND MOUNTING THE ELECTRONIC PARTS

Figure 15:
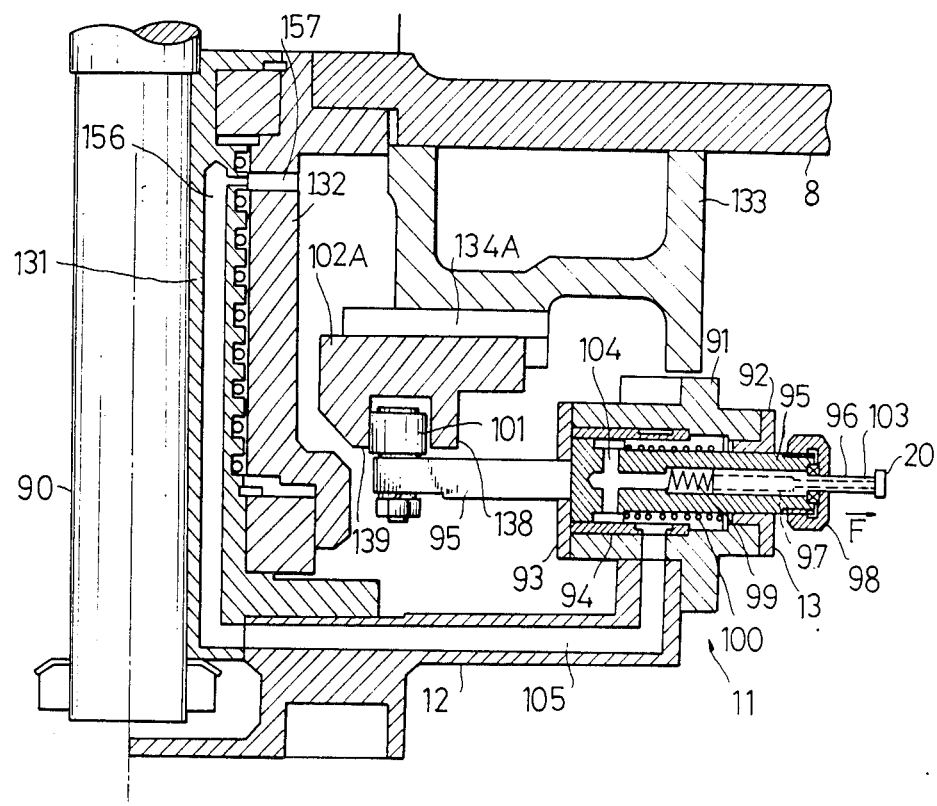
FIG. 15 is a top view, partially in section of the right portion of means for receiving and mounting chip type electronic parts, in accordance with the present invention.
Figure 16:
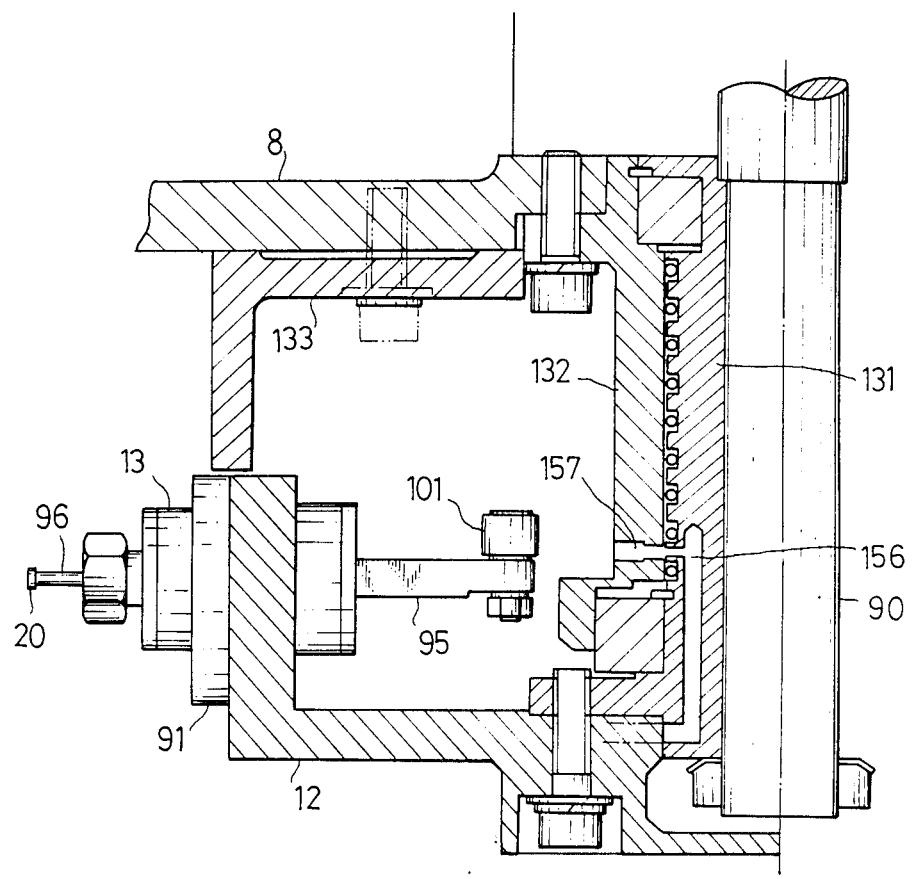
FIG. 16 is a top view, partially in section of the left hand portion of the receiving and mounting means of FIG. 15.
Figure 17:
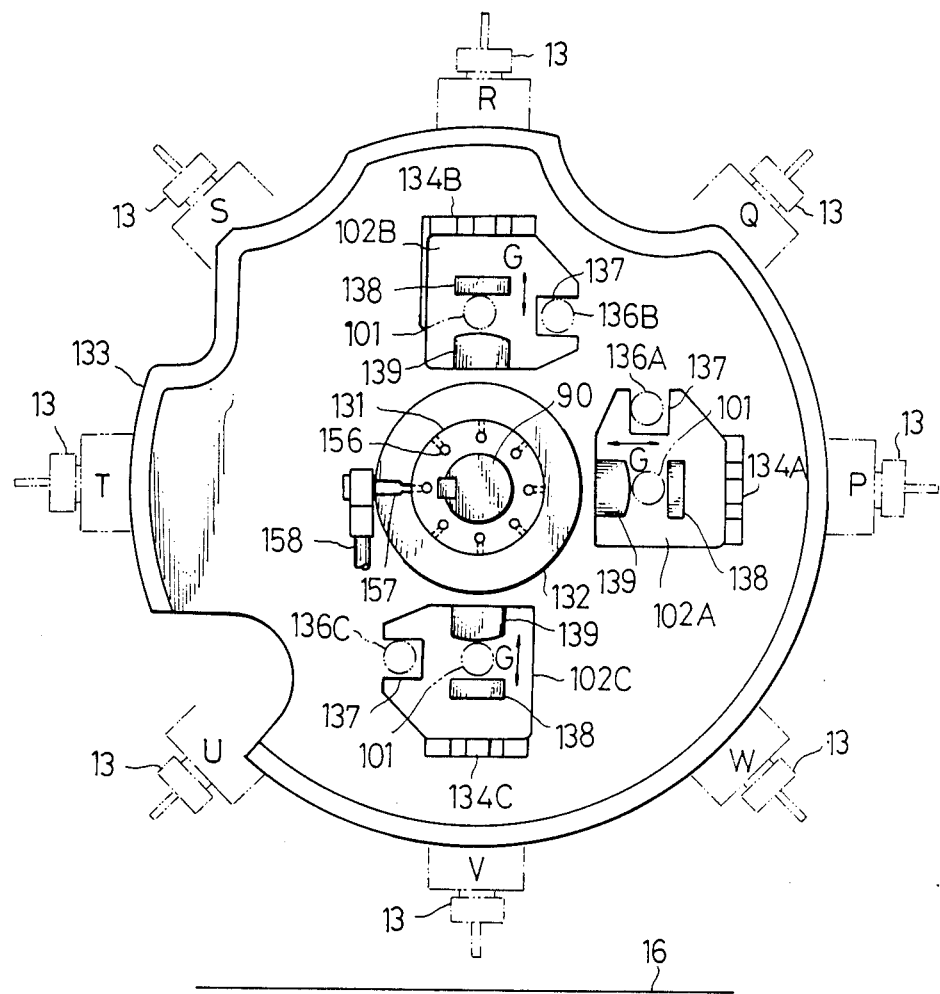
FIG. 17 is a front elevational view of the receiving and mounting means of FIGS. 15 and 16, illustrating a supporting plate and actuating slider portion thereof.

As illustrated in FIGS. 15 and 16, means 11 for receiving a chip type electronic part and mounting the same upon a printed circuit board, for example, comprises an intermittent rotating shaft 90 projecting from the front of the body frame 8, an inner cylindrical shaft 131 fitted around the intermittent rotating shaft 90, and an outer cylindrical shaft 132 fitted around the inner cylindrical shaft 132. An indexing disc 12 is engaged with these shafts. Mounting heads 13 are radially provided on the indexing disc 12 at equal-angle intervals, such as at 45° intervals as illustrated in FIGS. 2 and 17. The inner cylindrical shaft 131 jointly rotates with the intermittent rotating shaft 90, while the outer cylindrical shaft 132 is affixed on the body frame 8.

Each mounting head 13 comprises an outer cylinder 91 affixed on the indexing disc 12, bearing members 92, 93, 94 provided on both ends thereof and inside of the outer cylinder 91, a through-slide member 95, and a suction pin 96. The suction pin 96, which draws the chip type electronic part 20 off the pallet 4 at its tip, is slidably fitted within a center concavity 97 of the through-slide member 95, and is retained against disengagement off the mounting head 13 by a nut 98 or the like which is screwed onto a tip of the through-slide member 95.

A compression spring 99 for urging the suction pin 96 in an extended, projecting direction indicated by arrow F in FIG. 15, is also provided in the center concavity 97 of the through-slide member 95. Furthermore, the through-slide member 95 is slidably supported on the outer cylinder 91 affixed on the indexing disc 12, and is urged in a receding direction (counter to the direction of arrow F in FIG. 15) by a return spring 100. A roller 101 is provided on an inner or rear end of the through-slide member 95.

Roller guides (or thrust bearings) 134A, 134B, and 134C are provided on a supporting plate 133 which is positioned at the rear of the indexing disc 12 and is affixed onto the body frame 8 at the right, upper and lower portions thereof as illustrated in FIG. 17. Actuating sliders 102A, 102B, and 102C are provided at positions corresponding to respective mounting heads 13 as illustrated in FIG. 17, at locations where the sliding operation of the through-slide member 95 is necessary.

These respective actuating sliders 102A, 102B, and 102C are each provided with a concavity 137 engaging respective actuating rollers 136A, 136B and 136C, with the respective sliders adapted to move in a radial direction indicated by the arrows G in FIG. 17, in accordance with movement of the actuating rollers 136A, 136B and 136C, themselves. A pair of engaging projections 138, 139 are formed on each of the actuating sliders 102A, 102B and 102C, with the surface of the engaging projections 139 being curved or arced as illustrated in FIG. 17. Rollers 101, each disposed on a rear end of a respective through-slide member 95, are disposed between the engaging projections 138 and 139 of the respective actuating sliders 102A, 102B and 102C. Since the surface of the engaging projection 139 is curved or arced, the receiving and mounting operation with means 11 can occur in a smooth fashion.

A suction hole 103 is formed at the center of a respective suction pin 96, with vacuum suction paths 104, 105, 156 and 157 respectively formed in the through-slide member 95, the indexing disc 12, the inner cylindrical shaft 131, and the outer cylindrical shaft 132, all such vacuum suction paths being in communication, and with a vacuum suction pipe 158 connected to the vacuum suction path 157 of the outer cylindrical shaft 132.

In the operation of the means 11 for receiving and mounting the individual chip type electronic parts, the indexing disc 12 is rotated at 45° intervals according to the rotation of the intermittent rotating shaft 90. Then, when a mounting head 13 stops at an intermediate point of the portion where pallet 4 runs in a circular arc around sprocket 1B, namely at the point P illustrated in FIGS. 2 and 17 where the chip type electronic part 20 is shifted from the pallet 4 onto mounting head 13, the roller 101 on the rear end of the mounting head 13 at that point P is engaged between the projections 138 and 139 of the actuating slider 102A on the right side position of the supporting plate. In this position, the through-slide member 95 advances in a rightward direction according to a rightward move of actuating slider 102A caused by actuating roller 136A, thus pressing the suction pin 96 onto the chip type electronic part 20 on the pallet 4. In this case, excessive projection of the suction pin 96 is absorbed by the compression spring 99. After suction of the chip type electronic part 20 onto the pin 96 of the mounting head 13, the through-slide member 95 of the mounting head 13 at the point P is reset by the return spring 100.

The mounting head 13 draws the chip type electronic part 20 off the pallet 4 with the suction pin 96, passing point Q according to the incremental 45° rotation of the indexing disc 12, and then reaching point R. Means 14 for orienting the chip type electronic part disposed upon mounting head 13, to be described infra, is disposed opposite the mounting head 13 positioned at point R.

At point R, roller 101 on the rear end of mounting head 13 engages projections 138, 139 of the actuating slider 102B which is moved in an upward direction by the actuating roller 136B. Thus, the through-slide member 95 advances upwardly, with the suction pin 96 extending up into the means 14 for reorienting the chip type electronic part 20, so that the same can be subjected to positioning and re-orienting. The through-slide member 95 of the mounting head 13 is then reset at point R by the return spring 100.

The mounting head 13 retaining the positioned chip type electronic part 20, then passes through points S, T, U to reach point V, as illustrated in FIGS. 2 and 17. The printed circuit board 16 is supported on the X-Y table under point V. Roller 101 on the rear end of the mounting head 13 engages projections 138, 139 of the actuating slider 102C at point V, the through-slide member advances in a downward direction according to a downward move of the actuating slider 102C by the actuating roller 136C, and the suction pin 96 is extended forwardly in a downward direction, i.e. in the direction of circuit board 16, thereby mounting the chip type electronic part 20 onto the circuit board 16 at an adhesive coating position, for example. The through-slide member 95 of the mounting head 13 is then reset at point V by the return spring 100.

MEANS FOR SHIFTING THE ELECTRONIC PARTS ONTO THE RECEIVING AND MOUNTING MEANS

Figure 18:
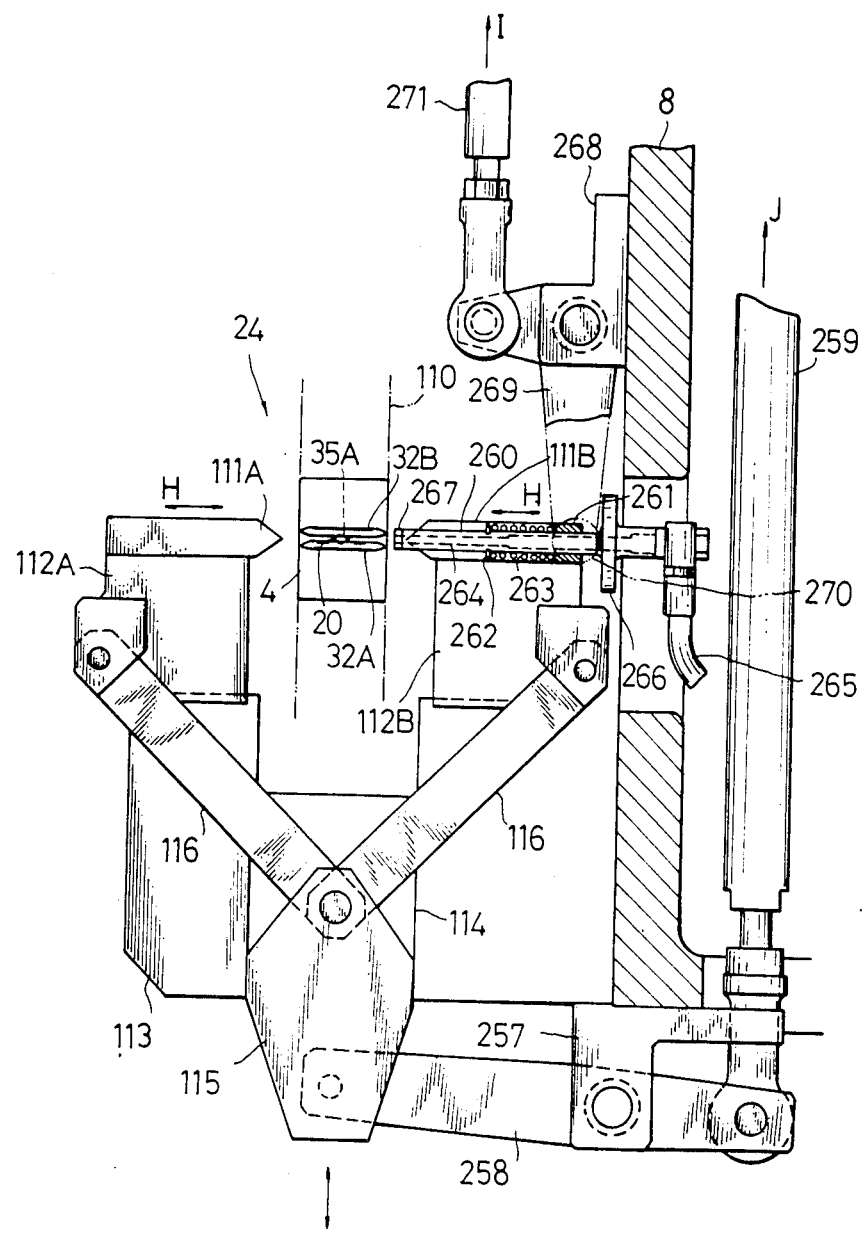
FIG. 18 is a front elevational view of means for shifting the chip type electronic parts onto the receiving and mounting means, in accordance with the present invention.
Figure 19:
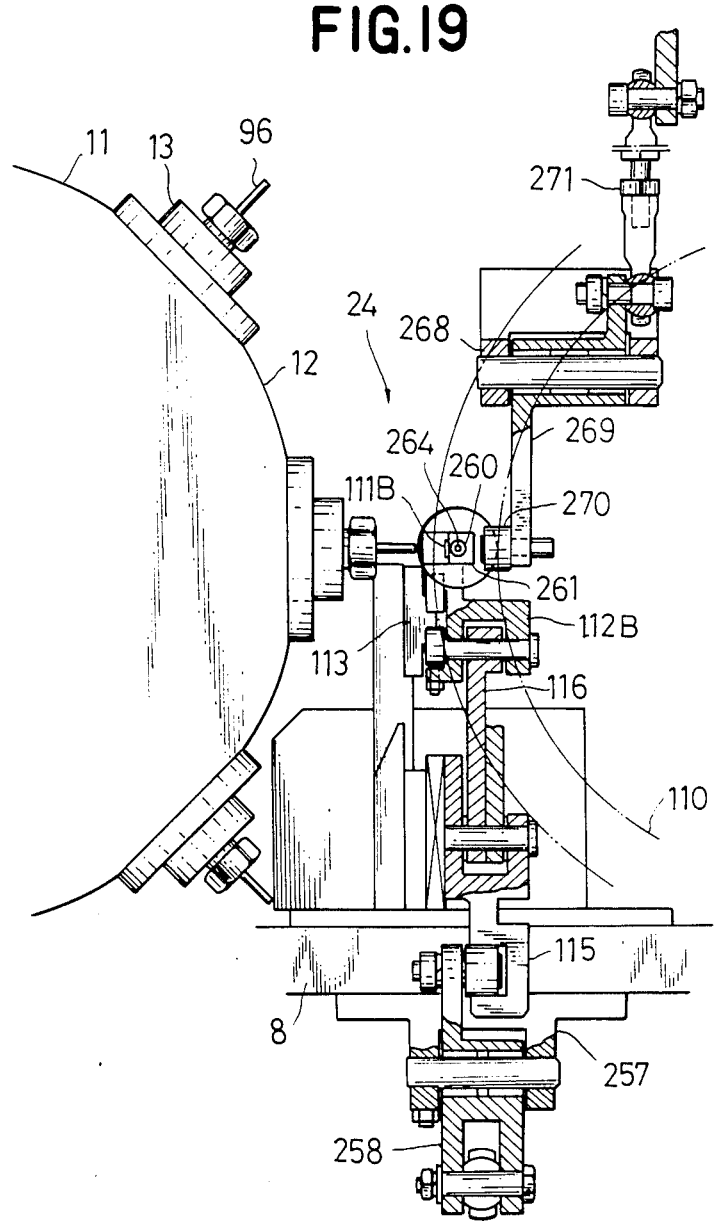
FIG. 19 is a side sectional view of the shifting means of FIG. 18.

FIGS. 18 and 19 illustrate means 24 for shifting individual chip type electronic parts 20 from the respective pallets 4 onto the mounting heads 13 of the receiving and mounting means 11. Referring to the figures, a pair of mullers 111A, 111B with fairly sharp tips are affixed onto respective slide blocks 112A, 112B in such a manner that a runway 110 along which the respective pallets 4 pass around sprocket 1B, will pass between both sharp tips of the respective mullers 111A, 111B. The slide blocks 112A, 112B are slidingly engaged with a supporting member 113, which is in turn engaged with the body frame 8. Slide blocks 112A, 112B are adapted to slide in a substantially horizontal direction, in other words in the direction indicated by arrow H in FIG. 18.

Supporting member 113 has a guide groove 114 in which a vertical slider 115 is slidably supported. Slide blocks 112A, 112B are coupled to the vertical slider 115 through respective links 116 of substantially equal length. Thus, both mullers 111A, 111B are symmetrically moved in the directions H with respect to a pallet disposed on the runway 111 between the muller tips, by keeping a center line of a respective pallet 4 and a center line of the vertical slider 115 coincident with one another. The vertical slider 115 is coupled to one end of a lever 258 retained by a bracket 257 affixed onto body frame 8, with the other end of the lever 258 being coupled to a rod 259 for transmitting a driving force from the cam.

A shifting suction rod 260 is slidably disposed in parallel with muller 111B on a support 261 of the slide block 112B, the shifting suction rod 260 being slidable in a substantially horizontal direction (i.e. in direction H) and being urged forwardly, in the direction of the pallets 4 on the runway 110, by a compression spring 263 disposed between a ring 262 fitted midway along the shifting suction rod 260 and the support 261. A shifting suction hole 264 is formed at the center of the suction rod 260, with a pipe 265 being connected to a rear end of the shifting suction rod 260 in order to suction air out of suction hole 264 to create a vacuum therein.

A stopper disc 266 is formed at a position near the rear of the shifting suction rod 260 away from the pallet runway 110, with a nose of the shifting suction rod 260 being formed of a packing member 267 such as rubber or the like. A bell crank 269 is retained by a bracket 268 affixed to the body frame 8, with a roller 270 on one end of the bell crank 269 coming into contact with the stopper disc 266 to regulate position of the shifting suction rod 260. The other end of the bell crank 269 receives a driving force from a cam through a rod 271.

In operation, when a pallet 4 retaining a chip type electronic part 20 thereon arrives and stops at the shifting position, namely the position opposite to the mounting head 13 at point P as illustrated in FIGS. 2 and 17, the rod 271 ascends as indicated by arrow I in FIG. 18, so that the bell crank 269 consequently turns in a clockwise direction and the stopper disc 266 is prevented from regulation by the roller 270. Thus, the shifting suction rod 260 is advanced by the compression spring 263 and is pushed onto a side of the pallet 4.

The shifting suction hole 264 on the shifting suction rod 260 then communicates with suction hole 35 in pallet base 30 of the pallet 4. Thus, a vacuum is then applied to the interior of hole 35 in the pallet base 30, the opening 35A on the bedplate 31 of pallet 4 being covered by the chip type electronic part. This prevents the chip type electronic part 20 from inadvertently dropping off the pallet 4 when the same is in the vertical position along runway 110 on sprocket 1B, as illustrated in FIGS. 2 and 17.

In this position, rod 259 ascends as indicated by arrow J in FIG. 18, with the vertical slider 115 thus being driven downwardly, so that both mullers 111A, 111B approach one another to contact the tapered surfaces of the round retaining bars 32A, 32B of the pallet 4, which are thereby opened or spread apart, away from the chip type electronic part 20.

Then, mounting head 13 advances to suction and retain the chip type electronic part 20 on the suction pin 96. The shifting suction rod 260 recedes thereafter, and after the mounting head 13 is reset, the mullers 111A, 111B also recede, and the arrival of the next respective pallet 4 containing a chip type electronic part 20, is awaited.

MEANS FOR ORIENTING THE CHIP TYPE ELECTRONIC PART

FIGS. 20-26 illustrate means 14 for positioning and orienting or reorienting the chip-type electronic parts 20 that are each disposed upon a respective mounting head 13 on the indexing disc 12 of the means 11 for receiving the electronic parts 20 and mounting the same upon a printed circuit board. As illustrated in the figures, a supporting frame 120 is disposed at a position opposite the position of the mounting head 13 at the point R (FIG. 20) on a top of the front of the body frame 8, with a pulse motor 121 being provided on the supporting frame 120. A rotating member 123 with the lower end thereof forming a regular, quadrangular column, is affixed onto a rotating shaft 122 of the motor 121, with a pair of gripping levers 124A, 124B being pivoted on a first face of the quadrangular column formed by the rotating member 123, these gripping levers being pivoted thereto at supporting points 125A, 125B, respectively.

A pair of gripping levers 124C, 124D are pivoted in a like manner on a second face of the quadrangular column of the rotating member 123, orthogonal to the first face at supporting points 125C, 125D respectively. Horizontal gripping parts 354A, 354B, 354C and 354D in contact with a side of the chip type electronic part 20, are formed on the respective lower ends of the gripping levers 124A, 124B, 124C and 124D as illustrated in FIGS. 23-26.

Rollers 126 are provided on the respective upper ends of gripping levers 124A, 124C, with pins 127 being provided at intermediate locations on the gripping levers 124A, 124C. Gripping levers 124B, 124D have concavities provided therein for engaging and mating with the respective pins 127. Consequently, both the gripping levers 124A, 124B, along with the other gripping levers 124C, 124D are symmetrically moved with respect to the center of the suction pin 96 of the mounting head 13 in position R, by maintaining a center line of the suction pin 96 coincidence with a bisector of the interval between tips of the gripping levers 124A, 124B, and the tips of the other gripping levers 124C, 124D.

Figure 20:
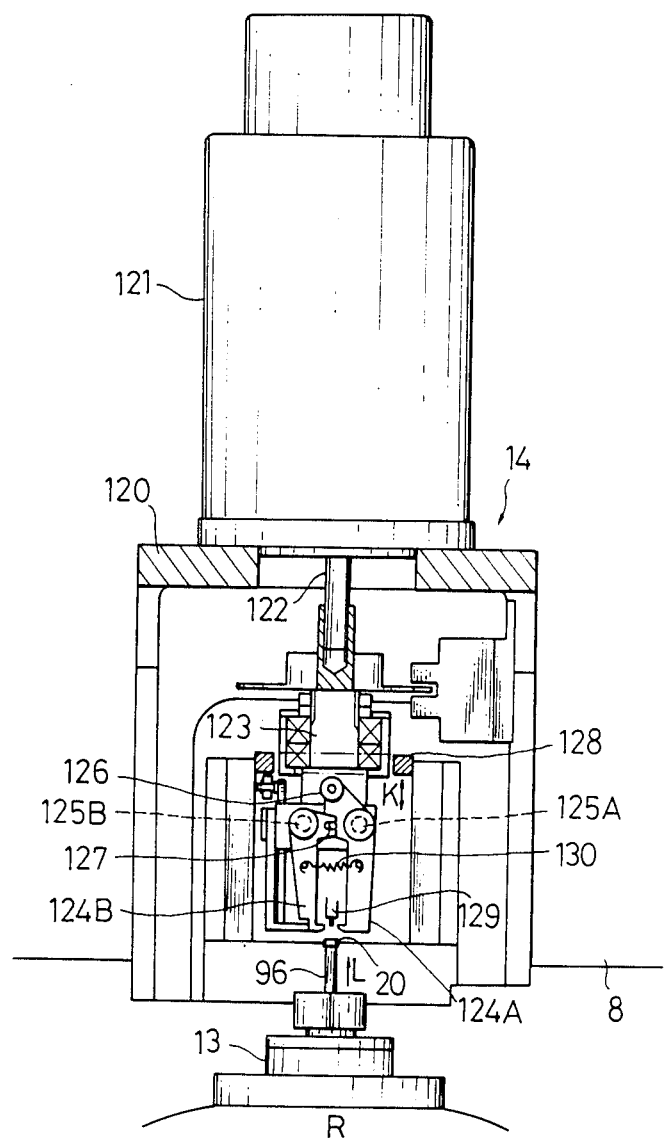
FIG. 20 is a front elevational view of means for orienting the chip type electronic parts upon the receiving and mounting means, in accordance with the present invention.
Figure 21:
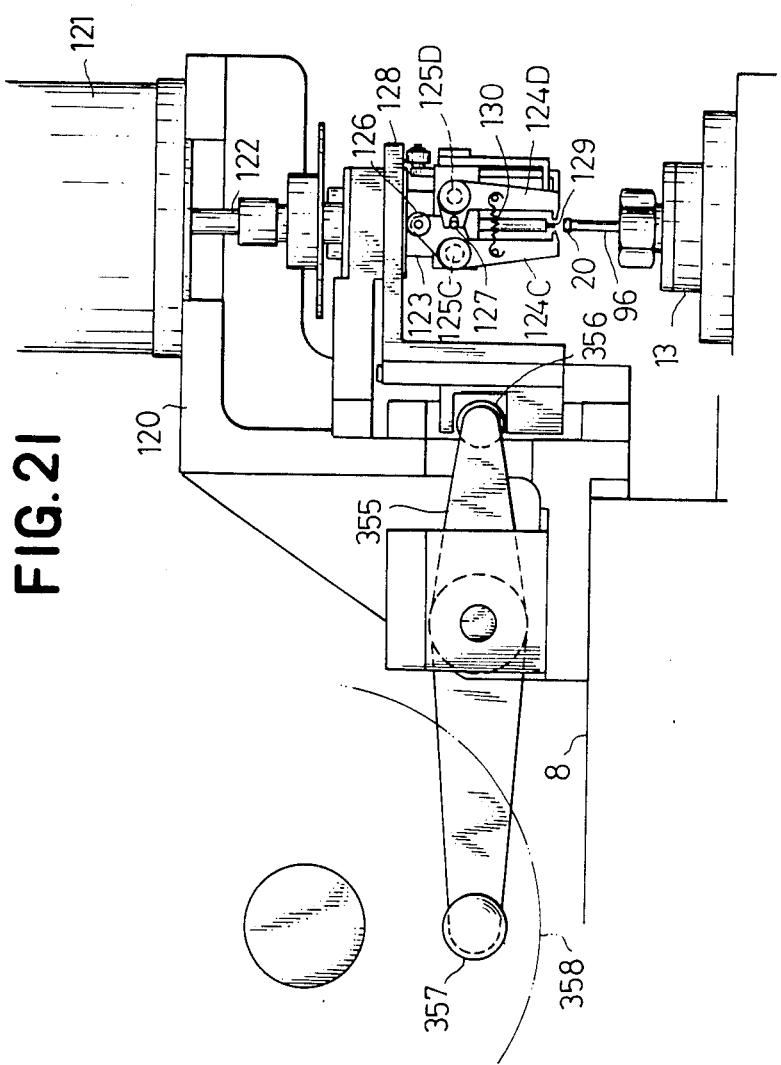
FIG. 21 is a side sectional view of the orienting means of FIG. 20.
Figure 22:
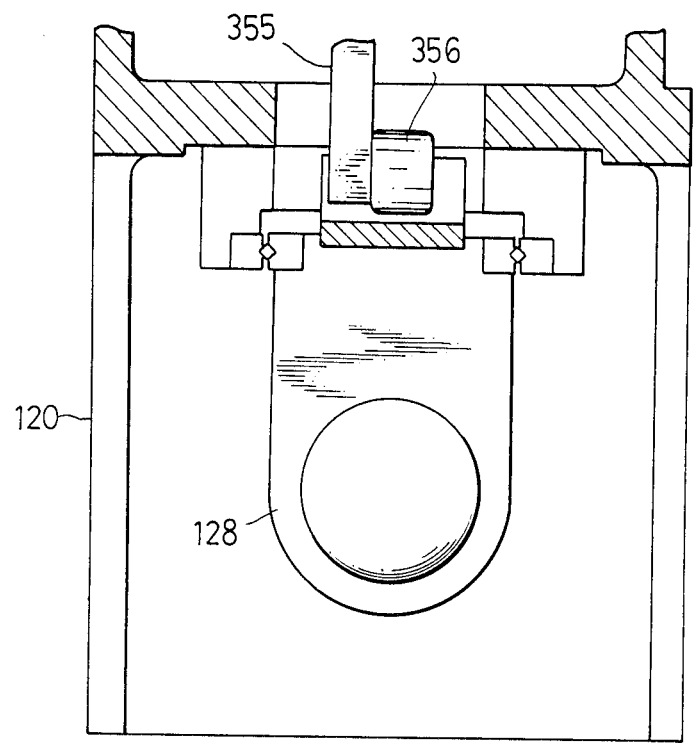
FIG. 22 is a top view, partially in section, of the orienting means of FIGS. 20 and 21, illustrating an actuating member and peripheral mechanism.
Figure 23:
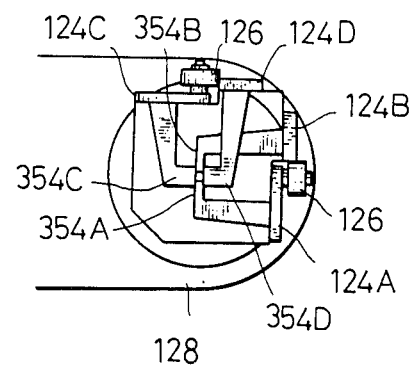
FIG. 23 is a bottom plan view of the orienting means of FIGS. 20–22.

An actuating member 128, adapted to move vertically in the direction indicated by arrow K in FIG. 20 to close the gripping levers 124A, 124B and to also close the gripping levers 124C, 124D, is slidably disposed around rotating member 123 as illustrated in FIG. 21, to be movable up and down in a vertical plane (direction K). The rear of the actuating member 128 engages a roller 356 as illustrated in FIG. 22, this roller 356 being mounted on one end of a lever 355 which is retained on the side of the body frame 8. A roller 357 on the other end of lever 355 comes into contact with a cam 358, thus receiving a driving force from this cam 358. A stopper 129 for retaining the top of the chip type electronic part 20 is disposed in the middle of the tips of both the gripping levers 124A, 124B and the gripping levers 124C, 124D, in other words in the middle of the horizontal gripping parts 354A, 354B, 354C and 354D. Additionally, springs 130 are connected between respective gripping levers 124A, 124B and levers 124C, 124D for urging the tips of the same in a closed direction (i.e. close to one another).

Figure 24:
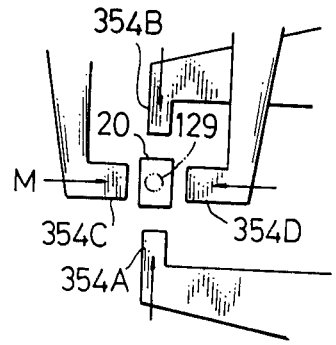
FIGS. 24–26 are illustrations of the operation of the orienting means of FIGS. 20–23.

In this particular embodiment of the reorienting means 14, when actuating member 128 receives a driving force of the cam 358 through the lever 359, the actuating member 128 descends, with the rollers 126 being depressed and the gripping levers 124A, 124B on the first face of the quadrangular column of the rotating member 123 and the other gripping levers 124C, 124D on the second orthogonal face of the quadrangular column all being retained in an open position. In other words, in the position where the horizontal gripping parts 354A, 354B, 354C and 354D are retained open as illustrated in FIG. 24, the suction pin 96 of the mounting head 13 on which the chip type electronic part 20 is retained, may advance as indicated by arrow L in FIG. 20, as far until the chip type electronic part 20 comes into contact with the stopper 129. Thus, the chip type electronic part 20 will be disposed between the horizontal gripping parts of each gripping lever.

Figure 25:
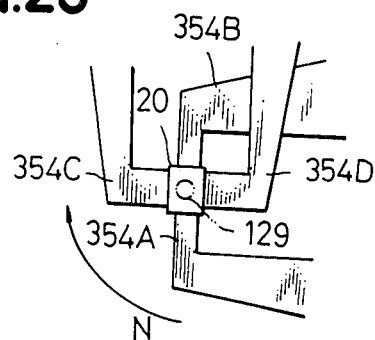

Then, the horizontal gripping parts 354A, 354B, 354C, and 354D of the respective gripping levers 124A, 124B, 124C and 124D, are all closed, as indicated by arrow M in FIG. 24, in accordance with the ascending of actuating member 128. Then, positioning and/or orienting is carried out with the chip 20 being in the gripped state as illustrated in FIG. 25. Referring to this particular figure, orientation is carried out by the pulse motor 21 operating to actuate the rotating member 123, to rotate the respective gripping levers 124A–D, thus also rotating the respective gripping parts 354A–D, and thus rotating the chip type electronic part 20. For example, as illustrated in FIG. 25, the electronic part 20 may be rotated in direction N, as the occasion demands. The chip type electronic part 20 may be oriented in any particular direction, for example at a 90° rotation, 180° rotation, in either a clockwise or a counterclockwise direction, as the conditions demand. An angle of rotation can be set arbitrarily.

Figure 26:
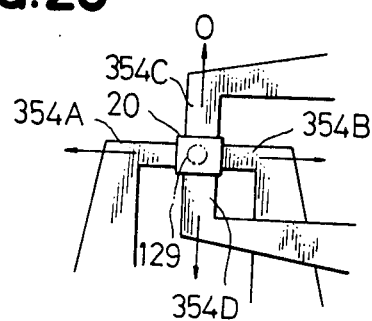

After orientation has been completed, the actuating member 128 again descends, with the horizontal gripping members 354A–D being thus opened as indicated by arrow 0 in FIG. 26. Then, the mounting head 13 retaining the chip type electronic part 20 so positioned that the center of this electronic part 20 coincides with the center of the suction pin 96, is reset to rotate to the next position, e.g. position S.

The overall operation of the apparatus and method of the present invention will now be described. Initially, a pallet 4, running intermittently on the horizontal runway 5, receives a supply of the chip type electronic parts 20 from the supply units 6A, 6B disposed on either side of the runway 5. Then, the respective pallets advance in a leftward direction as illustrated in FIG. 2, in the order of the ultimate mounting of the individual electronic parts 20 upon a printed circuit board 16. A pallet carrying a respective electronic part 20 first arrives at the positioning means 21. At this location, a positional correction is carried out so that the chip type electronic part will be accurately positioned at the center of the pallet 4, as illustrated in FIG. 9.

Figure 12A:
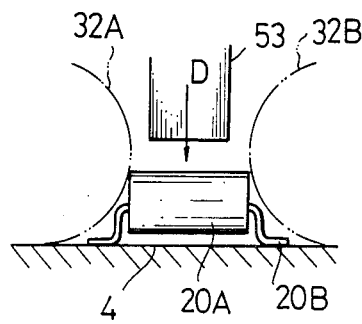
FIGS. 12(A) and (B) are operational diagrams of the transforming means of FIGS. 10 and 11.
Figure 12B:
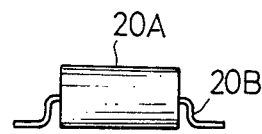

Next, the respective pallet 4 reaches the transforming means 22. Here, if the chip type electronic part does not contain any lead wires, the transforming means 22 is not actuated, and the pallet 4 continues on its passage along path 5. However, if the electronic part is of a transistor type 20A having leads 20B extending therefrom, then transforming means 22 is actuated and push rod 53 of transforming means 24 is extended as illustrated in FIG. 12(A), so that the lead electrode 20B of the transistor 20A will be disposed with the tip of the electrode coinciding approximately along the same plane as a bottom surface of the transistor 20A, as illustrated in FIG. 12(B).

The pallet 4, having passed the transforming means 22, next arrives at the detection means 23, where the pallet is then subject to a determination of whether or not a chip type electronic part 20 is disposed at a central, predetermined location on the pallet bedplate 31. Where the opening 35A of the suction hole 35 into the bedplate 31 is covered with a chip type electronic part 20, as illustrated in FIG. 4, a negative pressure created in the detecting suction hole 80 of the detecting means 22, will be relatively great; however, if there is no chip type electronic part 20 present on the pallet 4, the negative pressure created within detecting suction hole 80 will be relatively small or dissipate quite rapidly, thereby confirming that there is no chip type electronic part 20 at the proper location on the pallet 4. If a chip type electronic part 20 is detected at the proper location, then the remaining steps of the operation can proceed. However, when no chip type electronic part is detected at this point, subsequent operation is suspended, to investigate the reasons for the absence of a chip on the requisite pallet 4.

If a chip type electronic part 20 is detected at the proper location on the pallet 4, the operation proceeds with the pallet 4 descending along sprocket 1B and arriving at the shifting position opposite the mounting head 13 of receiving and mounting means 11, at the point P as noted. At this shifting position, the suction hole 35 within the pallet 4 is vacuum-suctioned to prevent the chip type electronic part 20 from falling off the pallet, and the mullers 111A, 111B of the shifting means 24 of FIG. 18, are advanced to spread apart the round retaining bars 32A, 32B of the pallet 4, to open the same. Then, the chip type electronic part 20 is suctioned and retained by the suction pin 96, by a forward extension of the mounting head 13 at the point P. The vacuum suction through the suction hole 35 of the pallet 4 is then terminated. Consequently, the chip type electronic part 20 is smoothly and accurately shifted from the pallet 4 onto the mounting head 13.

The mounting head 13 retaining the chip type electronic part 20 at the point P, then rotates in 45° intervals according to an intermittent rotation of the indexing disc 12, and reaches point R by passing point Q. At point R, the chip type electronic part 20 is oriented by the orienting means 14 as illustrated in FIG. 20, so that the center of the chip type electronic part 20 and the center of the suction pin 96 on the mounting head 13, will coincide with each other. This rotation also changes the orientation, where necessary, by rotating the chip type electronic part 20 at a predetermined angle.

The mounting head 13, then passes through points S, T, and U to arrive at point V, where the mounting head 13 descends to mount the chip type electronic part 20 upon the printed circuit board 16 at a predetermined location.

The following effects and advantages are attained with the above described embodiment of the present invention:

(1) The pallet 4 is conveyed on an endless belt mechanism running the chain 2 within a horizontal and a vertical plane, with the supply units 6A, 6B being disposed on both sides of the horizontal plane or runway 5 of the pallet 4, to thereby minimize the space required for installation and operation of an apparatus of the present invention.

(2) Positioning means 21 and detecting means 23 are provided midway along the horizontal path 5 of the pallet 4. Therefore, the chip type electronic part will be securely retained in the proper position on a pallet 4, and misfeed and/or mismounting of a chip type electronic part will be prevented.

(3) The transforming means 22 is provided along the horizontal runway 5 for the pallets 4, so that chip type electronic parts in the form of transistors having lead electrodes for example, can be successfully mounted by the apparatus and method of the present invention.

(4) The chip type electronic part 20, suctioned by mounting head 13, is regulated for position/orientation by the orienting means 14, with the chip type electronic part 20 being retained only on suction pin 96 of the mounting head 13. Therefore, the mounting head 13 and concomitant mechanism can greatly be simplified in structure and in operation.

As described above, the smoothness and reliability of mounting chip type electronic parts on a printed circuit board, can be greatly enhanced with the mounting apparatus, method, and particular pallet of the present invention. The above-described exemplary embodiment can be modified as conditions require, within the purview of the present invention. It is again noted that the above description is merely exemplary, and is not intended to limit the scope of the present invention in any way, shape or form.

What is claimed is:

1. A method for mounting chip type electronic parts having leads extending therefrom, comprising the steps of
supplying the part onto means for conveying the same to be mounted,
positioning the part on said conveying means,
detecting presence/absence of the part on said conveying means, after positioning of the same upon said conveying means,
removing the part off said conveying means and mounting the same, and
transforming the individual chip type part after the positioning step and before the detecting step, so that a tip of a lead thereof and a bottom surface of the electronic part are disposed in substantially the same plane.

2. The method of claim 1 comprising the additional step of
orienting the part after removal from said conveying means and before mounting, so that the part is mounted with a particular orientation.

3. An apparatus for mounting a chip type part for electronic application to a printed circuit board, comprising
means for conveying the part to be mounted,
means for supplying the part onto said conveying means,
means for receiving the part from said conveying means and for mounting the same, and
means for positioning the part upon said conveying means before transferring the same to said receiving and mounting means, wherein
said conveying means comprise an endless belt having a portion running in a substantially horizontal plane and a portion passing through a substantially vertical direction, said belt adapted to carry a series of pallets for receiving the part from said supplying means;
said supplying means comprise at least one supply unit disposed on either side of the horizontal portion of said belt, and
said receiving and mounting means comprise at least one mounting head for receiving the part at a particular position from the pallet, and for mounting the same upon the printed circuit board.

4. The apparatus of claim 3, in which the pallet comprises a base and a hole formed within the base of the pallet, and said apparatus additionally comprising means for detecting presence/absence of the part upon a respective pallet, after the pallet passes by said positioning means, said detecting means comprising
a detecting rod,
a suction hole formed within said detecting rod and adapted to communicate with the hole formed within the base of the pallet, and
means coupled to said detecting rod for pressing said detecting rod against the pallet so that the respective holes of the pallet and rod communicate,
whereby when a part covers an opening of a hole within the base of the pallet, a negative pressure applied within the holes in communication is maintained, and
when a part does not cover the opening of the hole within the base of the pallet, a negative pressure produced within said suction hole in said suction rod is thereby dissipated.

5. The apparatus of claim 1, in which
the chip type electronic part has at least one lead extending therefrom, and
the apparatus additionally comprises means for transforming the chip type electronic part to be disposed on the respective pallet with the bottom of the part and the lead extending therefrom in substantially the same plane, said transforming means comprising a slide block, and a push rod affixed to said slide block and adapted to be substantially vertically slidable therewith, to depress a top of the chip type, electronic part retained on the pallet.

6. The apparatus of claim 1, in which said positioning means comprises a pair of blocks adapted to slide in a substantially horizontal direction, a pair of positioning pins, each pin disposed on a respective slide block, opposite one another, and a member adapted to move in a substantially vertical direction and coupled to each of said slide blocks, so that when said member is raised, said blocks and pins extend towards one another in the substantially horizontal direction, to contact and position the part upon the pallet.

7. The apparatus of claim 4, in which the pallet comprises a pair of bars movably disposed on the base and adapted to retain the part disposed thereon, a pair of steps on said base, each step disposed on a respective side of said hole, and means for urging the bars close to one another to retain the part on the pallet, said urging means comprising a pair of leaf springs, each leaf spring seated between a respective step and bar.

8. The apparatus of claim 1, in which said receiving and mounting means comprise a rotatable shaft rotatably mounted in a frame of said apparatus and adapted to rotate at discrete intervals, an indexing disc disposed upon said rotatable shaft, a plurality of said mounting heads disposed at discrete radial intervals about said indexing disc, each mounting head comprising a suction pin for drawing the part off a respective pallet, and a through-slide member engaged with a respective suction pin, said receiving and mounting means additionally comprising a support plate disposed on a rear side of said indexing disc and affixed to the frame of said apparatus, and at least one actuating slider slidably disposed upon said support plate and adapted to actuate the through-slide member to extend said suction pin.

9. The apparatus of claim 8, in which said actuating slider is adapted to engage a rear portion of said through-slide member at predetermined intervals.

10. The apparatus of claim 1, additionally comprising means for shifting the part from a respective pallet onto a respective mounting head of said receiving and mounting means, the pallet being formed with a pair of bars for retaining the part thereon and a suction hole adapted to be covered by the part retained on the respective pallet, in which said shifting means comprise a shifting suction rod, a suction hole disposed within said shifting suction rod and adapted to communicate with the hole within the pallet, and a pair of mullers, at least one of which being engaged with said suction rod, said mullers adapted to move towards one another and to move the pair of bars on the pallet apart, when said suction rod contacts the pallet and a vacuum suction is applied to the hole in the pallet through said suction hole in said suction rod.

11. The apparatus of claim 1, additionally comprising means for orienting the part when the same is disposed upon said mounting head of said receiving and mounting means, which comprises a rotatable member, and at least one pair of gripping levers engaged with said rotatable member, said levers adapted to grip and rotate the part about said mounting head.

12. The apparatus of claim 11, in which said orienting means additionally comprise a rotatable motor and shaft affixed to said rotatable member, and a stopper engaged with said rotatable member and adapted to contact the top of the chip type electronic part retained by the pair of gripping levers.

13. The apparatus of claim 12, in which said pair of gripping levers comprise a first lever having a pin positioned thereon, and a second lever having a complementary concavity for mating with said pin positioned on said first gripping lever.

14. A pallet for conveying a chip type part, comprising a base, a pair of retaining bars disposed on said base and adapted to retain the part disposed thereon, and means for urging said retaining bars close to one another to retain the part on the pallet.

15. The pallet of claim 14, additionally comprising a hole disposed in said base, a pair of steps on said base, each step formed on a respective side of said hole, and wherein said means for urging said retaining bars close to one another to retain the part on said pallet, comprise a pair of leaf springs, each leaf spring seated between a respective step and bar.

* * * * *